(12) United States Patent
Shimizu (10) Patent No.: US 6,559,064 B1
(45) Date of Patent: May 6, 2003

(54) METHOD AND APPARATUS FOR REMOVING PHOTORESIST ON SEMICONDUCTOR WAFER

(75) Inventor: Yuji Shimizu, Tokyo (JP)

(73) Assignee: NEC Electronics Corporation (JP)

( * ) Notice: Subject to any disclaimer, the term of this patent is extended or adjusted under 35 U.S.C. 154(b) by 0 days.

(21) Appl. No.: 09/588,120

(22) Filed: Jun. 5, 2000

(30) Foreign Application Priority Data

Jun. 4, 1999 (JP) .......................................... 11-157288

(51) Int. Cl.⁷ ........................ H01L 21/302; B05C 11/02
(52) U.S. Cl. ...................... 438/745; 438/706; 438/753; 438/689; 438/749; 438/906; 438/980; 118/50.1; 118/634; 118/642; 118/58
(58) Field of Search ................................ 438/745, 708, 438/906, 753, 725, 689, 704, 706, 749, 980; 156/643, 646, 345, 655, 668; 118/50, 58, 634, 642

(56) References Cited

U.S. PATENT DOCUMENTS

| | | | |
|---|---|---|---|
| 4,341,592 A | | 7/1982 | Shortes et al. ............... 156/643 |
| 4,924,800 A | * | 5/1990 | Tanaka ......................... 118/50 |
| 5,378,317 A | * | 1/1995 | Kashiwase et al. .......... 438/704 |
| 5,503,708 A | * | 4/1996 | Koizumi et al. ............. 438/708 |
| 5,747,387 A | * | 5/1998 | Koizumi et al. ............. 438/708 |
| 5,911,837 A | * | 6/1999 | Matthews ......................... 134/2 |
| 6,274,506 B1 | * | 8/2001 | Christenson et al. ........ 438/748 |

FOREIGN PATENT DOCUMENTS

| | | | | |
|---|---|---|---|---|
| JP | 1-189921 | | 7/1989 | ............ H01L/21/30 |
| JP | 1-233729 | | 9/1989 | ............ H01L/21/30 |
| JP | 6-224168 | | 8/1994 | ......... H01L/21/304 |
| JP | 6-275515 | | 9/1994 | ......... H01L/21/027 |
| JP | 7-160007 | | 6/1995 | ............. G03F/7/42 |
| WO | WO 95/02895 | | 1/1995 | ......... H01L/21/304 |

* cited by examiner

Primary Examiner—Matthew Smith
Assistant Examiner—Igwe U. Anya
(74) Attorney, Agent, or Firm—Hayed Soloway P.C.

(57) ABSTRACT

For removing a photoresist formed on a semiconductor wafer by using an ozone-dissolved water, until just before a low temperature ozone-dissolved water generated by an ozone-dissolved water generator is discharged from a discharge nozzle onto a semiconductor wafer placed on a stage, the semiconductor wafer is heated to a predetermined temperature which is higher than ordinary temperatures. When the low temperature ozone-dissolved water having a high concentration of ozone is discharged onto the semiconductor wafer, the temperature of the ozone-dissolved water elevates upon the instant. Thus, the photoresist formed on the semiconductor wafer can be removed by a high temperature, high ozone concentration, ozone-dissolved water.

13 Claims, 6 Drawing Sheets

Fig. 6   Prior Art

METHOD AND APPARATUS FOR REMOVING PHOTORESIST ON SEMICONDUCTOR WAFER

BACKGROUND OF THE INVENTION

The present invention relates to a method and an apparatus for removing a photoresist on a semiconductor wafer.

In a photolithography process which is one step in a semiconductor device fabricating process, a photoresist is generally used as a mask for patterning. A film of this photoresist is removed when a patterning for a semiconductor device is completed. For a removing treatment of the photoresist film, it is a conventional practice to use a sulfuric-acid hydrogen-peroxide mixture (abbreviated to "SPM" hereinafter) which is heated to a temperature of not less than 100 degrees Celsius, or alternatively to use an organic solvent.

Since the removing treatment of the photoresist film using the SPM is carried out at a high temperature of not less than 100 degrees Celsius, the SPM is used after the SPM is ordinarily heated in a treating bath formed of quartz. Therefore, the amount of chemicals used becomes vary large, and in addition, the amount of the used treating liquid to be wasted correspondingly becomes voluminous.

Furthermore, in order to maintain the SPM at a high temperature in the treating bath, a load applied to a processing machine is large, and therefore, a maintenance for the processing machine must frequently be carried out. This is a disadvantage.

In the removing treatment of the photoresist film using the organic solvent, a similar problem is encountered. In particular, since the organic solvent is easy to volatilize, it is necessary to elevate the degree of sealing in the processing machine in order to prevent leak and diffusion of the organic solvent into ambiance of the processing machine. In addition, a severe management is required in a method for treating the used treating liquid (waste liquid)

In place of the SPM and the organic solvent which have the above mentioned various problems such as the load to the processing machine and the waste liquid treatment, attention is focused onto an ozone-dissolved water (ozonated water). Ozone has a high oxidative power, and the waste water has a short natural decomposition time. In addition, it is not necessary to carry out a special waste treatment. Since the ozone-dissolved water has the above mentioned various advantages, the ozone-dissolved water can be relatively easily applied into a semiconductor fabricating line.

For example, Japanese Patent Application Pre-examination Publication Nos. JP-A-01-233729, JP-A-06-275515 and JP-A-09-501017 disclose a method and an apparatus for removing the photoresist by using the ozone-dissolved water. JP-A-09-501017 corresponds to WO 95/02895, the content of which is incorporated by reference in its entirety into this application. Japanese Patent Application Pre-examination Publication No. JP-A-06-224168 discloses an apparatus for removing the photoresist by using an ozone gas. In addition, Japanese Patent Application Pre-examination Publication No. JP-A-01-189921 proposes an apparatus for removing the photoresist by using the ozone-dissolved SPM.

Figure 5:
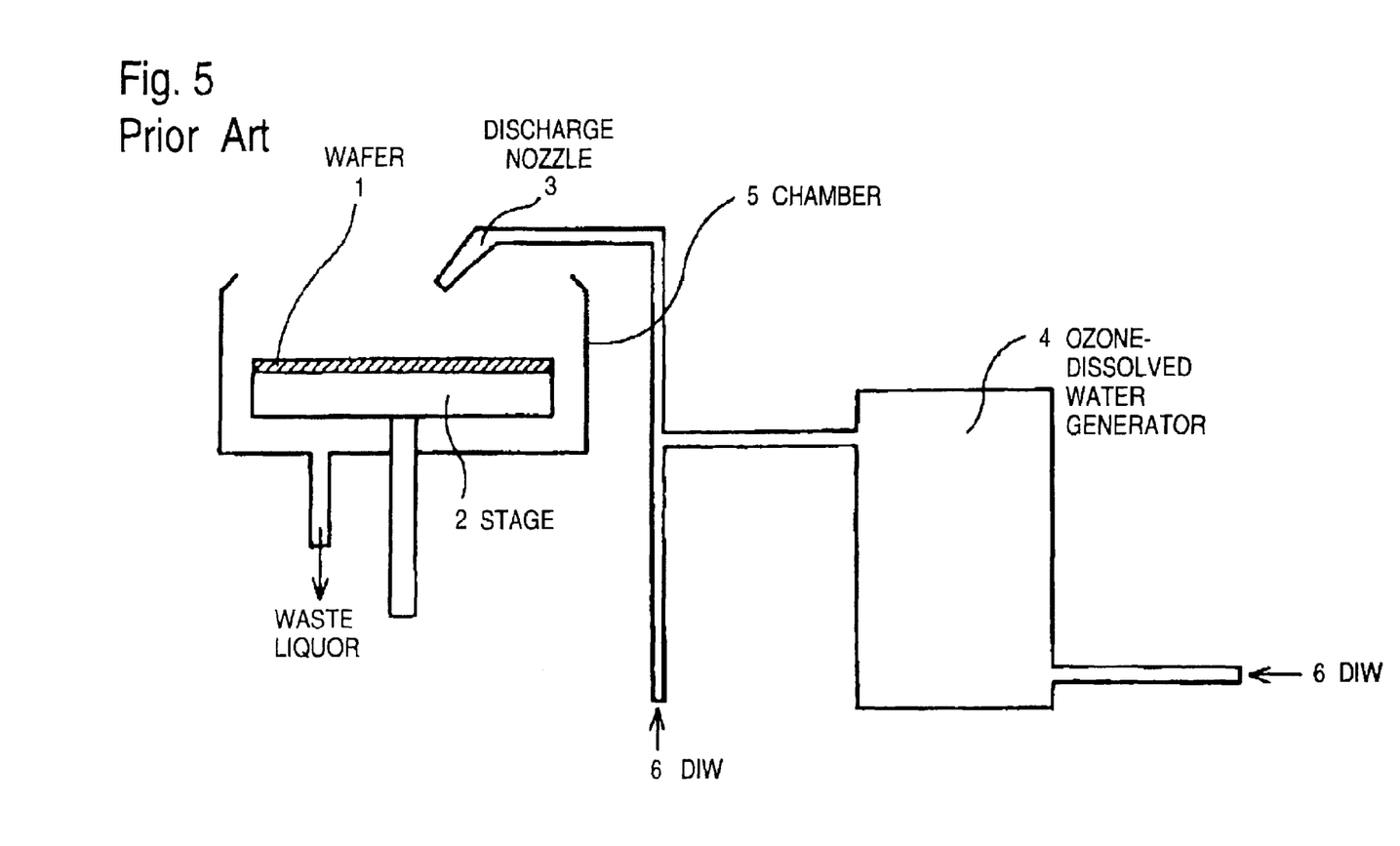
FIG. 5 is a schematic diagram illustrating an example of a prior art photoresist removing apparatus.

Referring to FIG. 5, there is illustrated an example of a prior art photoresist removing apparatus, which is a sheet-feed type wet treating machine so configured to treat wafers one after one.

As shown in FIG. 5, this photoresist removing apparatus comprises a rotating stage 2 for supporting a semiconductor wafer 1 thereon, a chamber 5 accommodating the stage 2 therein, a discharge nozzle 3 for discharging an ozone-dissolved water to a photoresist formed on the semiconductor wafer 1, and an ozone-dissolved water generator 4 discharging the ozone-dissolved water to the discharge nozzle 3.

This photoresist removing apparatus is used as follows:

First, after the semiconductor wafer 1 is vacuum-sucked to the stage 2, the semiconductor wafer 1 is rotated. In this condition, the ozone-dissolved water is discharged together with a deionized water (abbreviated to "DIW" hereinafter) from the discharge nozzle 3 onto the semiconductor wafer 1. The photoresist deposited on the semiconductor wafer 1 is removed by the ozone-dissolved water thus discharged.

However, the following problems have been encountered in the prior art method for removing the photoresist by using the ozone-dissolved water.

The concentration of the ozone dissolved in the DIW is inversely proportional to a DIW temperature. Namely, the higher the DIW temperature becomes, the lower the concentration of the ozone dissoluble to the DIW becomes.

Figure 6:
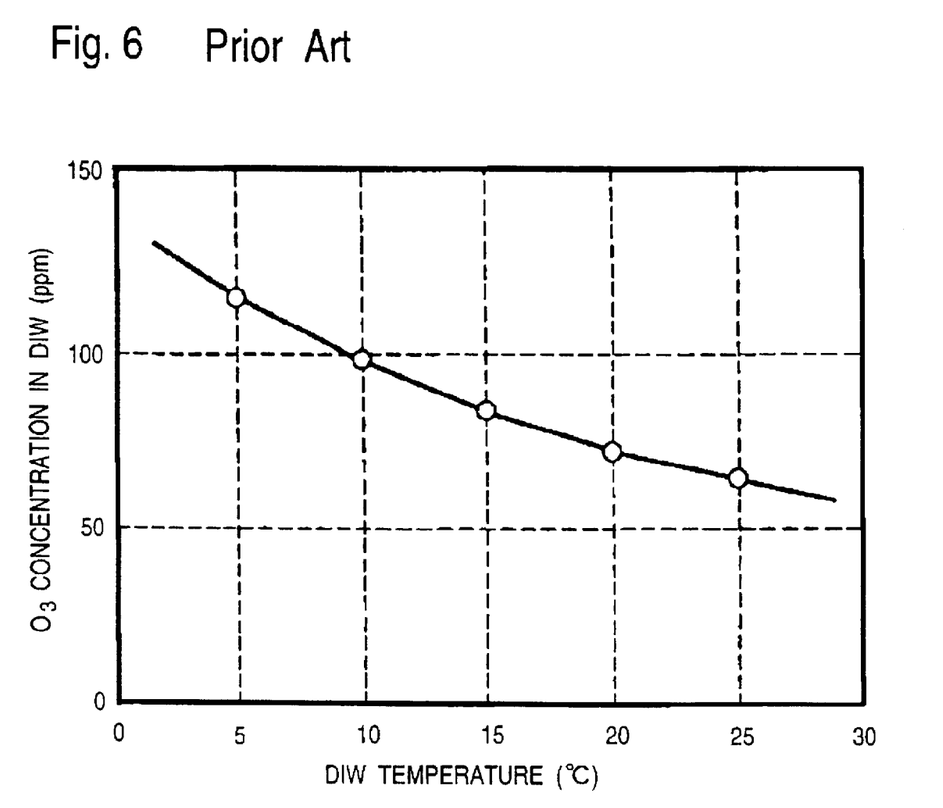
FIG. 6 is a graph illustrating the relation between the DIW temperature and the concentration of dissoluble ozone.

Referring to FIG. 6, there is shown a graph illustrating the relation between the DIW temperature and the concentration of dissoluble ozone. For example, when the DIW temperature is at 5 degrees Celsius, about 120 ppm of ozone is dissoluble. When the DIW temperature is at 25 degrees Celsius, only about 65 ppm of ozone is dissoluble.

An etching rate of the photoresist by the ozone-dissolved water is in proportion to the concentration of the ozone in the DIW and also in proportion to the temperature of the ozone-dissolved water.

Accordingly, it is ideally preferred that the concentration of ozone in the ozone-dissolved water is high and the temperature of the ozone-dissolved water is also high. However, since the temperature of the ozone-dissolved water and the concentration of ozone in the ozone-dissolved water are in inverse proportion to each other as mentioned above, even if the ozone-dissolved water having a high concentration of ozone is prepared at a low water temperature, when the water temperature is elevated later, the ozone in the ozone-dissolved water is decomposed, with the result that when the ozone-dissolved water is actually discharged to the photoresist, the ozone-dissolved water has already become an ozone-dissolved water having only a low concentration of ozone.

As mentioned above, in the prior art photoresist removing method, it is not possible to remove the photoresist by using a high concentration, high temperature, ozone-dissolved water, with the result that the photoresist removing was not necessarily effectively carried out.

BRIEF SUMMARY OF THE INVENTION

Accordingly, it is an object of the present invention to provide a photoresist removing method and apparatus, which have overcome the above mentioned problem of the prior art photoresist removing method.

Another object of the present invention is to provide a photoresist removing method and apparatus, capable of making it possible to remove the photoresist by using a high concentration and high temperature ozone-dissolved water.

The above and other objects of the present invention are achieved in accordance with the present invention by a method for removing a photoresist on a semiconductor wafer by using an ozone-dissolved water, the method comprising a first step of elevating the temperature of the semiconductor wafer, and a second step of discharging the ozone-dissolved water onto the semiconductor wafer when the temperature of the semiconductor wafer reaches a predetermined temperature.

With the above mentioned photoresist removing method, the ozone-dissolved water is maintained at a low temperature until just before the ozone-dissolved water is discharged onto the semiconductor wafer. In other words, the ozone-dissolved water is maintained to have a high concentration of ozone until just before the ozone-dissolved water is discharged onto the semiconductor wafer. If the ozone-dissolved water having the high concentration of ozone is discharged onto the semiconductor wafer, since the temperature of the semiconductor wafer has been previously elevated to the predetermined temperature which is higher than that of the ozone-dissolved water thus discharged, the temperature of the ozone-dissolved water elevates upon the instant. With elevation of the temperature of the ozone-dissolved water, the decomposing reaction of the ozone occurs at a surface of the semiconductor wafer. With this decomposition of the ozone, a chemical reaction between the ozone and the photoresist is expedited. As a result, the etching rate of the photoresist is increased, so that the time required to remove the photoresist can be shortened.

According to another aspect of the present invention, there is provided a method for removing a photoresist on a semiconductor wafer by using an ozone-dissolved water, the method comprising a first step of elevating the temperature of the semiconductor wafer, a second step of discharging the ozone-dissolved water onto the semiconductor wafer when the temperature of the semiconductor wafer reaches a predetermined temperature, a third step of carrying out a rinse treatment for the semiconductor wafer, and a fourth step of drying the semiconductor wafer.

With this arrangement, the removing rate of the photoresist can be increased by discharging a low temperature, high concentration, ozone-dissolved water, similarly to the method in accordance with the first aspect of the present invention.

In one embodiment, in the second step, the semiconductor wafer is rotated around a center of the semiconductor wafer, and the ozone-dissolved water is discharged onto the rotating semiconductor wafer.

By rotating the semiconductor wafer, it is possible to discharge uniformly the ozone-dissolved water over the semiconductor wafer.

In a preferred embodiment, in the second step, during a period in which the ozone-dissolved water is discharged onto the semiconductor wafer, the semiconductor wafer continues to be heated.

By continuously heating the semiconductor wafer, it is possible to maintain the semiconductor wafer at the predetermined temperature, with the result that it is possible to continue the decomposing reaction of the ozone occurring at the surface of the semiconductor wafer. Therefore, it is possible to avoid the drop of the removing rate of the photoresist.

Preferably, the predetermined temperature is maintained at a temperature of not less than 100 degrees Celsius.

According to a third aspect of the present invention, there is provided an apparatus for removing a photoresist on a semiconductor wafer, the apparatus comprising a heater for heating the semiconductor wafer, an ozone-dissolved water generator for generating an ozone-dissolved water, and a discharge means for discharging the ozone-dissolved water generated by the ozone-dissolved water generator, onto the semiconductor wafer.

With the photoresist removing apparatus mentioned above, it is possible to discharge the ozone-dissolved water onto a photoresist formed on the semiconductor wafer by the discharge means after the semiconductor wafer is heated by the heater. Therefore, the ozone-dissolved water can be maintained at a low temperature until just before the ozone-dissolved water is discharged onto the semiconductor wafer. In other words, the ozone-dissolved water can be maintained to have a high concentration of ozone until just before the ozone-dissolved water is discharged onto the semiconductor wafer. If the ozone-dissolved water having the high concentration of ozone is discharged onto the semiconductor wafer, since the temperature of the semiconductor wafer has been previously elevated to the predetermined temperature which is higher than that of the ozone-dissolved water thus discharged, the temperature of the ozone-dissolved water elevates upon the instant. With elevation of the temperature of the ozone-dissolved water, the decomposing reaction of the ozone occurs at a surface of the semiconductor wafer. With this decomposition of the ozone, a chemical reaction between the ozone and the photoresist is expedited. As a result, the etching rate of the photoresist is increased, so that the time required to remove the photoresist can be shortened.

Preferably, the photoresist removing apparatus further includes a temperature sensor for sensing the temperature of the semiconductor wafer and a controller for controlling the heater on the basis of the temperature of the semiconductor wafer sensed by the temperature sensor.

By monitoring the temperature of the semiconductor wafer by the temperature sensor, it is possible to freely control the heater by action of the controller, with the result that the temperature of the semiconductor wafer can be maintained at a desired temperature.

For example, the heater can be constituted of an infrared lamp for irradiating infrared rays to the semiconductor wafer.

Furthermore, the photoresist removing apparatus includes a stage on which the semiconductor wafer is placed, and the heater can be incorporated in the inside of the stage.

If the heater is incorporated in the inside of the stage for supporting the semiconductor wafer thereon, it is possible to effectively heat the semiconductor wafer The above and other objects, features and advantages of the present invention will be apparent from the following description of preferred embodiments of the invention with reference to the accompanying drawings.

DETAILED DESCRIPTION OF THE INVENTION

Figure 1:
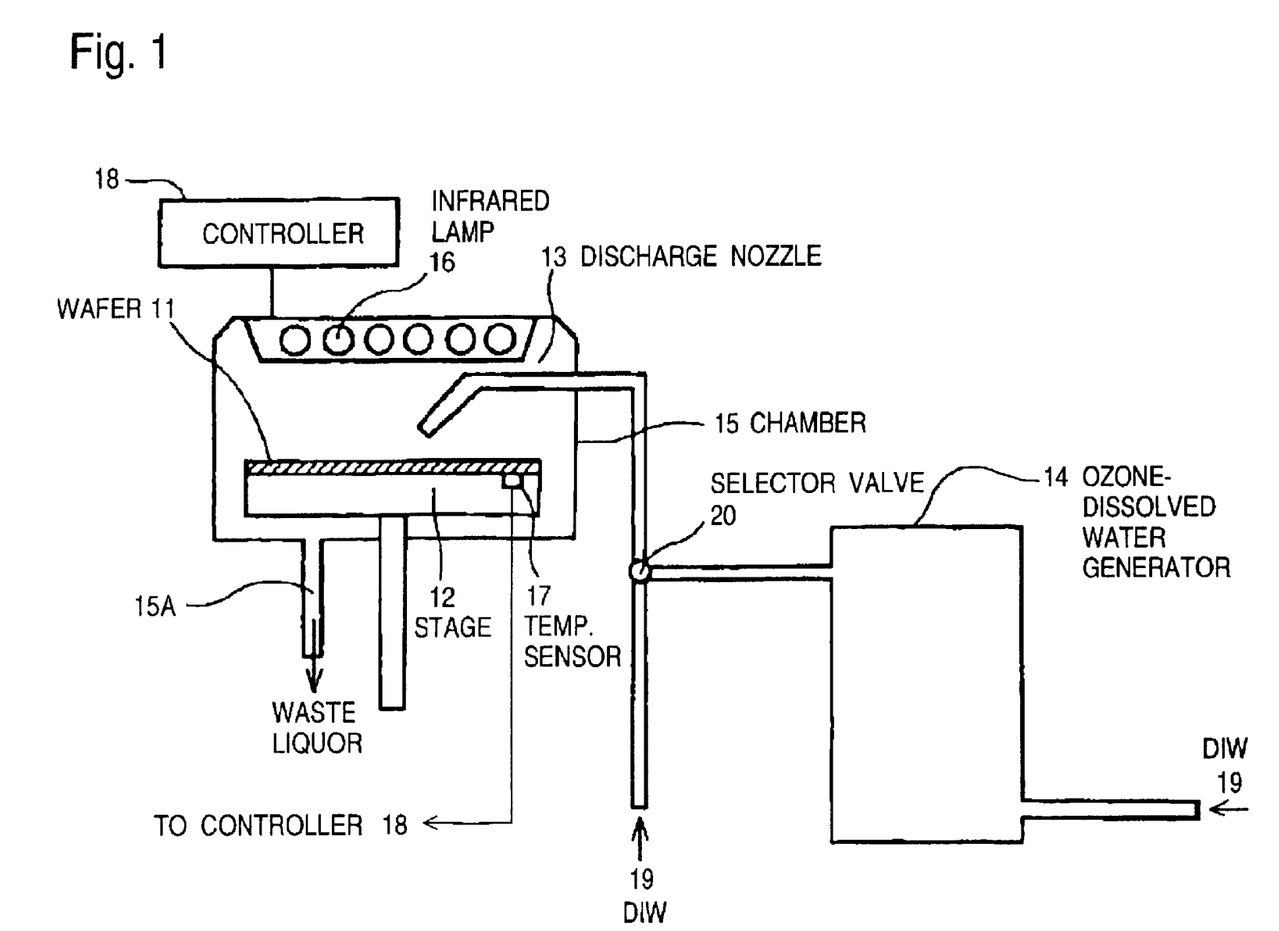
FIG. 1 is a schematic diagram illustrating a construction of a first embodiment of the photoresist removing apparatus in accordance with the present invention.

Referring to FIG. 1, there is shown a schematic diagram illustrating a construction of a first embodiment of the photoresist removing apparatus in accordance with the present invention. The shown photoresist removing apparatus is a sheet-feed type wet treating machine so configured to treat wafers one after one.

The shown photoresist removing apparatus comprises a rotating stage 12 for supporting a semiconductor wafer 11 thereon, an ozone-dissolved water generator 14 for preparing the ozone-dissolved wafer, a discharge nozzle 13 for discharging an ozone-dissolved water prepared by the ozone-dissolved water generator 14, onto the semiconductor wafer 11, a chamber 5 accommodating the stage 12 and the discharge nozzle 13 therein, an infrared lamp 16 mounted above the stage 12 within the chamber 15, for irradiating infrared rays onto the semiconductor wafer 11 so as to heat the semiconductor wafer 11, a temperature sensor 17 incorporated in the inside of the stage 12 for sensing the temperature of the semiconductor wafer 11, and a controller 18 for controlling the infrared ray exposure dose of the infrared lamp 16 on the basis of the temperature of the semiconductor wafer 11 sensed by the temperature sensor 17.

The stage 12 is so constructed to rotate around a center axis of the stage 12. The chamber 15 has an exhaust port 15A for exhausting the waste liquid.

A deionized water (DIW) 19 is supplied to the ozone-dissolved water generator 14, which dissolves ozone into the DIW 19 to prepare the ozone-dissolved water. In this embodiment, the ozone-dissolved water generator 14 prepares the ozone-dissolved water having an ozone concentration of about 100 ppm, for example, at a temperature of not higher than 10 degrees Celsius, as could be seen from FIG. 6.

In addition, the DIW 19 is also supplied to the discharge nozzle 13. For this purpose, the DIW 19 and the ozone-dissolved water prepared by the ozone-dissolved water generator 14 are supplied to a selector valve 20, so that either of the DIW 19 and the ozone-dissolved water is selected by the selector valve 20 and then supplied to the discharge nozzle 13.

Furthermore, in the shown embodiment, the infrared lamp 16 is so configured to be able to elevate the temperature of the semiconductor wafer 11 to a temperature of not less than 100 degrees Celsius.

The controller 18 controls not only the infrared ray exposure dose of the infrared lamp 16 but also a start and a stop of the rotation of the stage 12 and a rotational speed of the stage 12.

The above mentioned first embodiment of the photoresist removing apparatus is used as follows:

First, after the semiconductor wafer 11 having a photoresist deposited thereon is placed on the stage 12 within the chamber 15, and then, is vacuum-sucked to the stage 12 since the stage has a vacuum-suction function. Thus, the semiconductor wafer 11 is fixed on the stage 12.

After the semiconductor wafer 11 is fixed on the stage 12, the controller 18 energizes the infrared lamp 16 so that it starts to elevate the temperature of the semiconductor wafer 11 by action of the irradiation of the infrared rays.

If it is sensed by the temperature sensor 17 that the temperature of the semiconductor wafer 11 has reached 100 degrees Celsius, the temperature sensor 17 outputs a signal indicative of this fact to the controller 18. In response to this signal, the controller 18 causes the stage 12 to rotate.

Thereafter, the ozone-dissolved water prepared by the ozone-dissolved water generator 14 is discharged onto the semiconductor wafer 11 from the discharge nozzle 13.

In the course of discharging the ozone-dissolved water, the controller 18 controls to continuously energize the infrared lamp 16. Namely, the controller 18 controls the infrared ray exposure dose of the infrared lamp 16 on the basis of the signal from the temperature sensor 17, for the purpose of maintaining the semiconductor wafer 11 at 100 degrees Celsius.

In this embodiment, as mentioned above, the ozone concentration of the ozone-dissolved water is set to about 100 ppm. At this ozone concentration, the etching rate of the photoresist is about 6000 Å/min. Therefore, if the photoresist was deposited on the semiconductor wafer to have a thickness of 1 $\mu$m, the discharge time of the ozone-dissolved water is set to two minutes and thirty seconds, by considering an over-etching time.

After a removing treatment of the photoresist by using the ozone-dissolved water is completed, the selector valve 20 is changed over to the effect that the DIW 19 is discharged from the discharge nozzle 13 onto the semiconductor wafer 11 so as to carry out a rinse treatment for the semiconductor wafer 11 for one minute.

After the rinse treatment for the semiconductor wafer 11 is completed, the controller 18 controls the stage 12 to rotate the stage 12 at 1000 revolutions per minute for a drying treatment of the semiconductor wafer 11.

When the drying treatment of the semiconductor wafer 11 is completed, a series of photoresist removing steps are completed.

Incidentally, in the above mentioned embodiment, the ozone concentration of the ozone-dissolved water, the temperature of the ozone-dissolved water, the treating time, and the heating temperature of the semiconductor wafer are in no way limited to the above mentioned values, but can be freely set to values which meet with a capability of a semiconductor device fabricating line using the photoresist removing apparatus of the above mentioned embodiment.

In this embodiment of the photoresist removing apparatus, the ozone-dissolved water can be maintained at a low temperature until just before the ozone-dissolved water is discharged onto the semiconductor wafer 11. In other words, the ozone-dissolved water is maintained to have as a high concentration of ozone as 100 ppm until just before the ozone-dissolved water is discharged onto the semiconductor wafer 11. If this ozone-dissolved water having the high concentration of ozone is discharged onto the semiconductor wafer 11, since the temperature of the semiconductor wafer 11 has been previously elevated to the predetermined temperature which is higher than that of the ozone-dissolved water thus discharged, the temperature of the ozone-dissolved water elevates upon the instant. With elevation of the temperature of the ozone-dissolved water, the decomposing reaction of the ozone occurs at a surface of the semiconductor wafer 11. With this decomposition of the ozone, a chemical reaction between the ozone and the photoresist is expedited. As a result, the etching rate of the photoresist is increased, so that the time required to remove the photoresist can be shortened.

Figure 2:
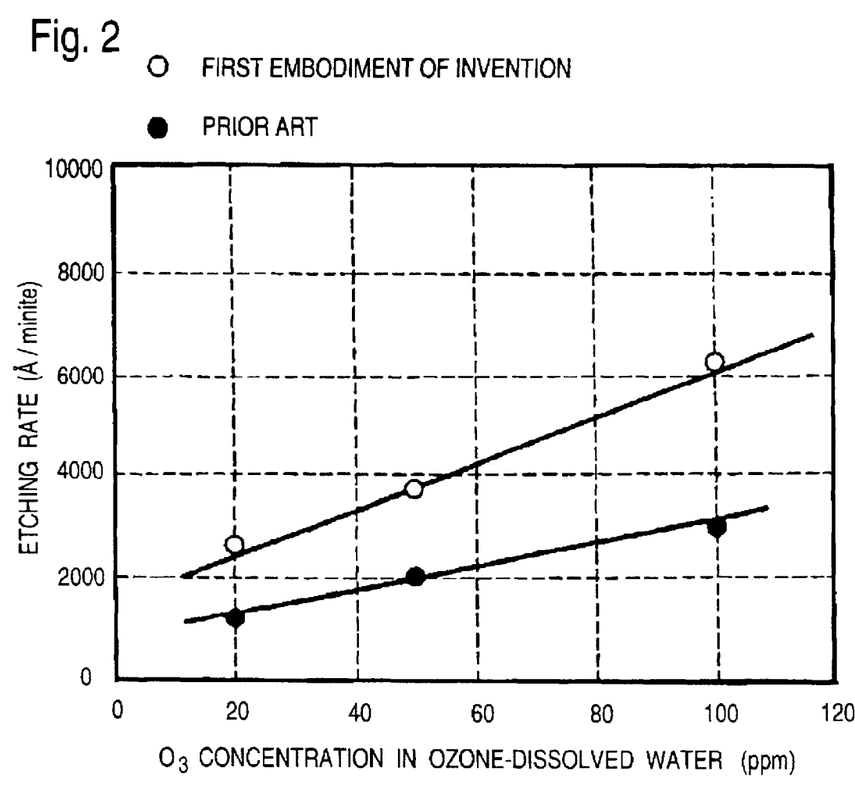
FIG. 2 is a graph illustrating the relation between the ozone concentration of the ozone-dissolved water and the etching rate of the photoresist, in a prior art photoresist removing apparatus and in the first embodiment of the photoresist removing apparatus in accordance with the present invention.

FIG. 2 is a graph illustrating the relation between the ozone concentration of the ozone-dissolved water and the etching rate of the photoresist, in a prior art photoresist removing apparatus in which the photoresist is removed by the ozone-dissolved water without heating the semiconductor wafer, and in the above mentioned first embodiment of the photoresist removing apparatus in accordance with the present invention.

Reviewing the etching rage when the ozone concentration of the ozone-dissolved water is at 100 ppm, the etching rate is about 3000 Å/min in the prior art photoresist removing apparatus, but about 6000 Å/min in the photoresist removing apparatus in accordance with the present invention. Namely, the photoresist removing apparatus in accordance with the present invention realizes the etching rate which is two times the etching rate obtained in the prior art photoresist removing apparatus. In other words, the photoresist removing apparatus in accordance with the present invention can shorten the photoresist removing time to a half of the photoresist removing time required in the prior art photoresist removing apparatus.

Figure 3:
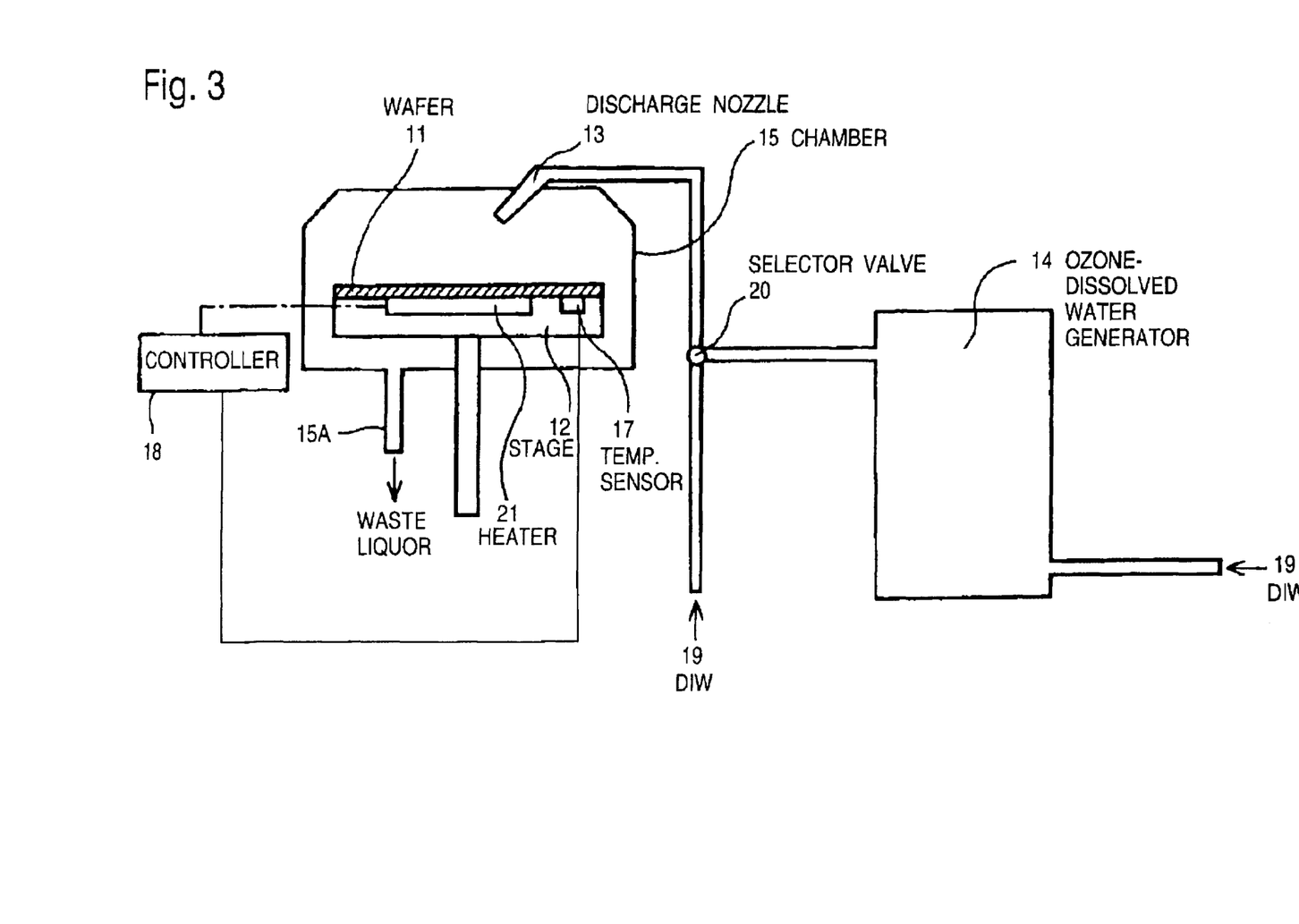
FIG. 3 is a schematic diagram illustrating a construction of a second embodiment of the photoresist removing apparatus in accordance with the present invention.

Referring to FIG. 3, there is shown a schematic diagram illustrating a construction of a second embodiment of the photoresist removing apparatus in accordance with the present invention. Similarly to the first embodiment of the photoresist removing apparatus, the shown second embodiment is a sheet-feed type wet treating machine so configured to treat wafers one after one.

The second embodiment is different from the first embodiment only in that the infrared lamp 16 provided in the first embodiment is replaced with a heater 21 internally provided in the stage 12. This heater 21 can elevate the temperature of the semiconductor wafer 11 to a temperature of not less than 100 degrees Celsius. Therefore, in FIG. 3, elements corresponding to those shown in FIG. 1 are given the same reference numbers, and explanation thereof will be omitted.

As mentioned above, since the second embodiment has the same construction as that of the first embodiment, excluding that the infrared lamp 16 is replaced with the heater 21, an operation of the second embodiment is the same as that of the first embodiment, and a photoresist removing advantage similar to that obtained in the first embodiment can be obtained in the second embodiment.

In addition to the photoresist removing advantage obtained in the first embodiment, the second embodiment can obtain the etching rate of the photoresist which is more excellent than that obtained in the first embodiment.

In the first embodiment of the photoresist removing apparatus, since the temperature of the semiconductor wafer 11 is indirectly elevated by the infrared lamp 16 located above the semiconductor wafer 11, a substantial time is required after the temperature of the semiconductor wafer 11 drops because of the discharging of the ordinary-temperature ozone-dissolved water until the temperature of the semiconductor wafer 11 is elevated. In the second embodiment, on the other hand, since the temperature of the semiconductor wafer 11 is directly elevated by the heater 21 incorporated in the inside of the stage 12, it is possible to minimize the drop of the temperature of the semiconductor wafer 11 caused because of the discharging of the ordinary-temperature ozone-dissolved water, and therefore, it is possible to return the temperature of the semiconductor wafer 11 to 100 degrees Celsius for a short time.

Figure 4:
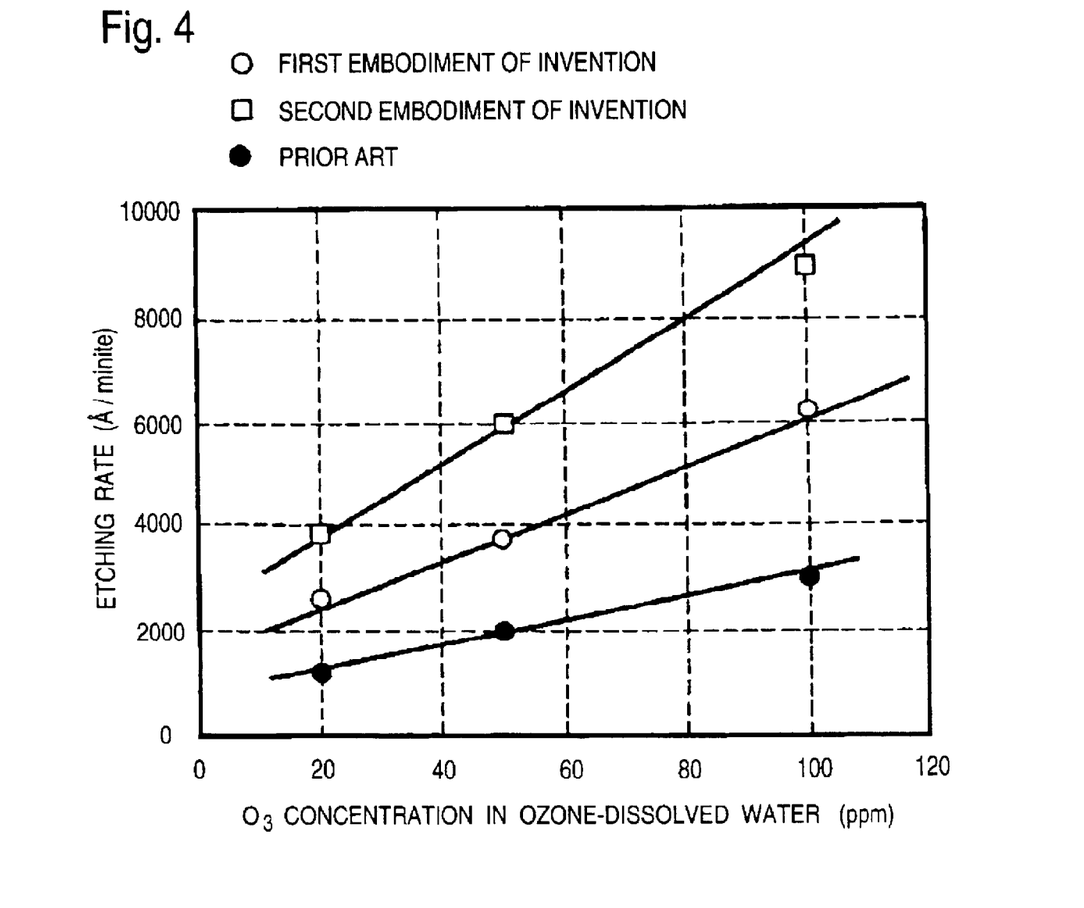
FIG. 4 is a graph illustrating the relation between the ozone concentration of the ozone-dissolved water and the etching rate of the photoresist, in the prior art photoresist removing apparatus and in the first and second embodiments of the photoresist removing apparatus in accordance with the present invention.

FIG. 4 is a graph illustrating the relation between the ozone concentration of the ozone-dissolved water and the etching rate of the photoresist, in the prior art photoresist removing apparatus and in the first and second embodiments of the photoresist removing apparatus in accordance with the present invention.

When the ozone concentration of the ozone-dissolved water is at 100 ppm, the etching rate is about 3000 Å/min in the prior art photoresist removing apparatus, and about 6000 Å/min in the first embodiment of the photoresist removing apparatus in accordance with the present invention. However, the etching rate is about 9000 Å/min in the second embodiment of the photoresist removing apparatus in accordance with the present invention. Namely, the second embodiment of the photoresist removing apparatus in accordance with the present invention realizes the etching rate which is one and half times the etching rate obtained in the first embodiment of the photoresist removing apparatus in accordance with the present invention.

Therefore, for example, in order to remove the photoresist having a thickness of 1 $\mu$m deposited on the semiconductor wafer by use of the ozone-dissolved water having the ozone concentration of 100 ppm, if the over-etching time is not considered, the first embodiment of the photoresist removing apparatus in accordance with the present invention needs about one minute and forty minutes until the photoresist removing operation can be finished, while the second embodiment of the photoresist removing apparatus in accordance with the present invention needs about one minute and ten minutes until the photoresist removing operation can be finished. Namely, the second embodiment can shorten photoresist removing time by about 30 minutes.

As seen from the above, according to the method and apparatus in accordance with the present invention for removing the photoresist on the semiconductor wafer, the ozone-dissolved water can be maintained at a low temperature until just before the ozone-dissolved water is discharged onto the semiconductor wafer. In other words, the ozone-dissolved water can be maintained to have a high concentration of ozone until just before the ozone-dissolved water is discharged onto the semiconductor wafer. If the ozone-dissolved water having the high concentration of ozone is discharged onto the semiconductor wafer, since the temperature of the semiconductor wafer has been previously elevated to the predetermined temperature which is higher than that of the ozone-dissolved water thus discharged, the temperature of the ozone-dissolved water elevates upon the instant, and the decomposing reaction of the ozone occurs at a surface of the semiconductor wafer. With this decomposition of the ozone, a chemical reaction between the ozone and the photoresist is expedited. As a result, the etching rate of the photoresist is increased, so that the time required to remove the photoresist can be shortened.

The invention has thus been shown and described with reference to the specific embodiments. However, it should be noted that the present invention is in no way limited to the details of the illustrated structures but changes and modifications may be made within the scope of the appended claims.

What is claimed is:

1. A method for removing a photoresist on a semiconductor wafer by using ozone dissolved in liquid water, the method comprising:

a first step of elevating the temperature of said semiconductor wafer; and a second step of discharging said ozone dissolved in liquid water onto said semiconductor wafer when the temperature of said semiconductor wafer reaches not less than 100° C.

2. A method claimed in claim 1, wherein in said second step, said semiconductor wafer is rotated around a center of said semiconductor wafer, and said ozone dissolved in liquid water is discharged onto the rotating semiconductor wafer.

3. A method claimed in claim 2, wherein in said second step, during a period in which said ozone dissolved in liquid water is discharged onto said semiconductor wafer, said semiconductor wafer continues to be heated.

4. A method for removing a photoresist on a semiconductor wafer by using ozone dissolved in liquid water, the method comprising:

a first step of elevating the temperature of said semiconductor wafer; and a second step of discharging said ozone dissolved in liquid water onto said semiconductor wafer when the temperature of said semiconductor wafer reaches not less than 100° C.

5. A method claimed in claim 4, wherein in said second step, during a period in which said ozone dissolved in liquid water is discharged onto said semiconductor wafer, said semiconductor wafer continues to be heated.

6. A method claimed in claim 4, wherein in said second step, said semiconductor wafer is rotated around a center of said semiconductor wafer, and said ozone dissolved in liquid water is discharged onto the rotating semiconductor wafer.

7. A method claimed in claim 6, wherein in said second step, during a period in which said ozone dissolved in liquid water is discharged onto said semiconductor wafer, said semiconductor wafer continues to be heated.

8. An apparatus for removing a photoresist on a semiconductor wafer, the apparatus comprising:

a heater for heating said semiconductor wafer in a first location to a temperature not less than 100° C.;

an ozonated water generator for dissolving ozone in unheated liquid water in a second location; and a discharge means for discharging said ozone dissolved in said unheated liquid water generated by said ozonated water generator in said second location, onto said heated semiconductor wafer in said first location.

9. An apparatus claimed in claim 8, further including a temperature sensor for sensing the temperature of said semiconductor wafer and a controller for controlling said heater on the basis of the temperature of said semiconductor wafer sensed by said temperature sensor.

10. An apparatus claimed in claim 9, wherein said heater is an infrared lamp for irradiating infrared rays to said semiconductor wafer.

11. An apparatus claimed in claim 9, further including a stage on which said semiconductor wafer is placed, said heater being incorporated in the inside of said stage.

12. An apparatus claimed in claim 8, wherein said heater is an infrared lamp for irradiating infrared rays to said semiconductor wafer.

13. An apparatus claimed in claim 8, further including a stage on which said semiconductor wafer is placed, said heater being incorporated in the inside of said stage.

\* \* \* \* \*